United States Patent [19]

Morgan

[11] 3,767,398

[45] Oct. 23, 1973

[54] SOLID PHOTORESIST COMPRISING A POLYENE AND A POLYTHIOL

[76] Inventor: Charles Robert Morgan, Silver Spring, Md.

[22] Filed: Oct. 26, 1971

[21] Appl. No.: 192,251

[52] U.S. Cl. .................. 96/36.2, 96/35.1, 96/115 P
[51] Int. Cl. .......................... G03c 1/68, G03c 5/00
[58] Field of Search ................ 96/35.1, 36.2, 115 P, 96/115 R, 88

[56] References Cited

UNITED STATES PATENTS

| | | | |
|---|---|---|---|
| 3,376,138 | 4/1968 | Giangualano | 96/36.2 |
| 3,556,793 | 1/1971 | Field | 96/115 R |
| 3,615,450 | 10/1971 | Werber | 96/35.1 |
| 3,656,951 | 4/1972 | Anderson | 96/36.2 |
| 3,660,088 | 5/1972 | Lundsager | 96/36.2 |
| 3,677,920 | 7/1972 | Kai | 96/115 P |

*Primary Examiner*—Norman G. Torchin
*Assistant Examiner*—Alfonso T. Suro Pico
*Attorney*—Richard P. Plunkett

[57] ABSTRACT

This invention is directed to a solid photoresist composition comprising a polyene, polythiol and photosensitizer admixture which when coated on a substrate to be modified, e.g., ceramic, glass, metal oxide and metal surfaces and exposed imagewise to actinic radiation results in an insoluble cured polythioether photoresist in the exposed segments with the unexposed segments of the composition being removed in suitable solvents to allow etching of the metal thereunder. Optionally, the solid photoresist composition can be covered with a transparent film to insure cleanliness, which film can be removed before or after exposure as desired.

12 Claims, 13 Drawing Figures

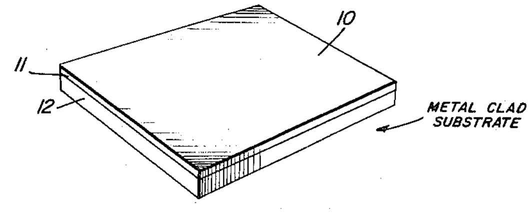

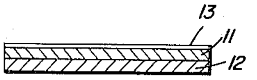

APPLY SOLID RESIST LAYER OF CURABLE COMPOSITION (13) TO METAL CLAD (11) OF SUBSTRATE (12)

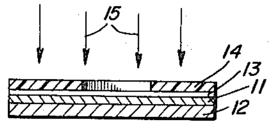

EXPOSE CURABLE COMPOSITION (13) TO FREE RADICAL GENERATOR, e.g. U.V. LIGHT (15) THROUGH IMAGE-BEARING TRANSPARENCY (14)

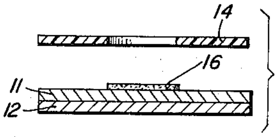

REMOVE TRANSPARENCY (14) AND UNEXPOSED CURABLE COMPOSITION LEAVING LAYER OF CURED PHOTORESIST COMPOSITION (16)

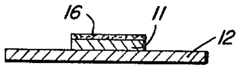

ETCH EXPOSED METAL FROM SUBSTRATE (12)

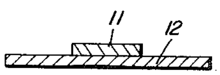

REMOVE CURED PHOTORESIST LAYER (16) LEAVING DEFINED METAL AREA (11) ON BASE (12)

Fig. 1

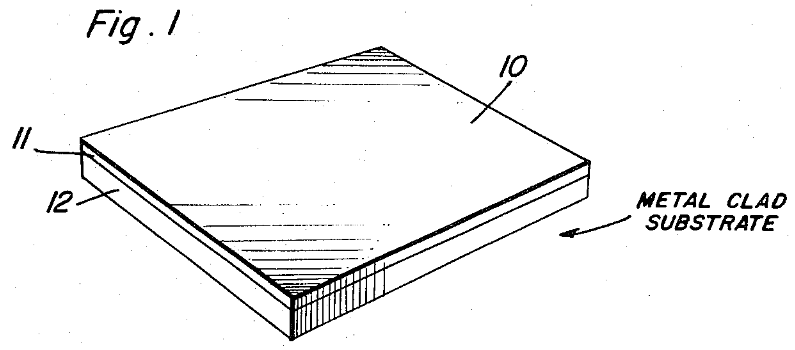

Fig. 2

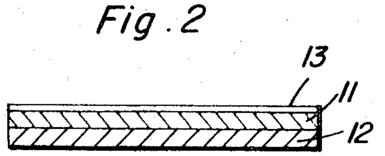

APPLY SOLID RESIST LAYER OF CURABLE COMPOSITION (13) TO METAL CLAD (11) OF SUBSTRATE (12)

Fig. 3

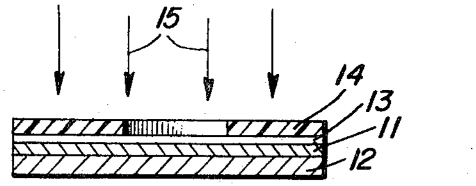

EXPOSE CURABLE COMPOSITION (13) TO FREE RADICAL GENERATOR, e.g. U.V. LIGHT (15) THROUGH IMAGE-BEARING TRANSPARENCY (14)

Fig. 4

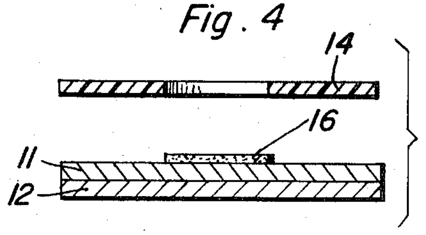

REMOVE TRANSPARENCY (14) AND UNEXPOSED CURABLE COMPOSITION LEAVING LAYER OF CURED PHOTORESIST COMPOSITION (16)

Fig. 5

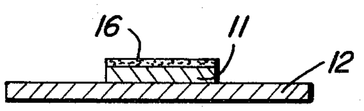

ETCH EXPOSED METAL FROM SUBSTRATE (12)

Fig. 6

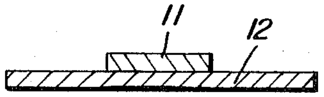

REMOVE CURED PHOTORESIST LAYER (16) LEAVING DEFINED METAL AREA (11) ON BASE (12)

Charles R. Morgan
INVENTOR

BY Richard P. Plunkett
ATTORNEY

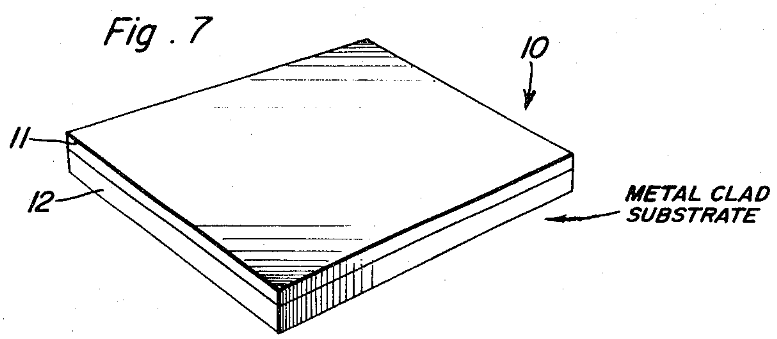

Fig. 7

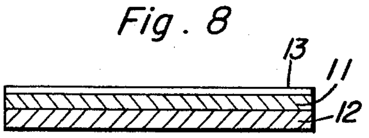

Fig. 8

APPLY SOLID RESIST LAYER OF CURABLE COMPOSITION (13) TO METAL CLAD (11) OF SUBSTRATE (12)

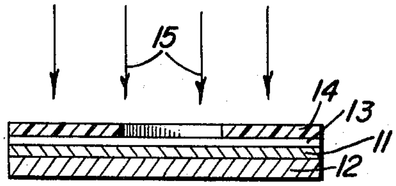

Fig. 9

EXPOSE CURABLE COMPOSITION (13) TO FREE RADICAL GENERATOR, e.g. U.V. LIGHT (15) THROUGH IMAGE-BEARING TRANSPARENCY (14)

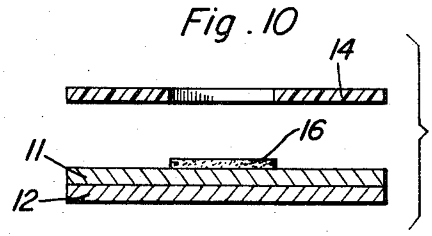

Fig. 10

REMOVE TRANSPARENCY (14) AND UNEXPOSED CURABLE COMPOSITION LEAVING LAYER OF CURED PHOTORESIST COMPOSITION (16)

Fig. 11

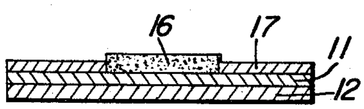

PLATE EXPOSED METAL SURFACE (11) WITH PLATING METAL (17)

Fig. 12

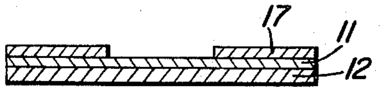

REMOVE RESIST LAYER OF CURED COMPOSITION (16) LEAVING DEFINED PLATED (17) METAL AREAS (11) ON SUBSTRATE (12)

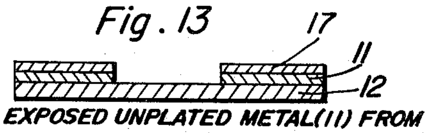

Fig. 13

ETCH EXPOSED UNPLATED METAL (11) FROM SUBSTRATE (12) LEAVING DEFINED METAL PLATED (17) AREA (11)

Charles R. Morgan
INVENTOR

BY Richard P. Plunkett
ATTORNEY

SOLID PHOTORESIST COMPRISING A POLYENE AND A POLYTHIOL

This invention relates to photoresists and more particularly to solid photoresists and to methods of making and utilizing same.

PRIOR ART

Photoresists are light sensitive materials which when applied as thin coatings or layers on chemically attackable solid substrates, will provide a chemically resistant protective coating in the light struck area. These solid substrates can be metals, wood, ceramics, glass, plastics, resins, fabrics, leather, synthetic or natural rubbers, etc. Generally, a very thin coating of the resist composition is coated onto the substrate, exposed image-wise either directly using a "point" radiation source or through a stencil or a photographic negative or positive to electromagnetic radiation, for example, UV light. After the image-wise exposure, the uncured or unpolymerized resist in the non-image areas is removed thereby exposing the solid substrate in selected areas. Thereafter the substrate may be etched using materials which are solvents for the substrate but nonsolvents for the photocured or photopolymerized resist.

Presently, the most commonly available resist materials are liquid photoresists. These materials and their utilization have many undesirable features. Usually, the coating and post curing procedures require time consuming baking steps. Similarly, resolution leaves something to be desired since it is necessary to maintain the image at a distance from the liquid photoresist to avoid marring the image and allow its reuse.

In the manufacture of certain printed circuits, these liquid photoresists clog "thru-holes" in double sided or multilayer printed circuits.

Although solid film photoresists have been developed to eliminate some of the aforementioned disadvantages, these materials nevertheless still possess unfavorable characteristics which are also common to the liquid resists, e.g., slow exposure times, limited resolution and decreased resistance to etching and plating environments.

The attributes of a good photoresist composition are (1) that it adheres to the substrate firmly and readily on photocuring or photopolymerization or both, (2) is resistant to the etching and plating environments for the substrate and (3) is easily removed by a solvent which does not affect the protected area.

THE INVENTION

In accordance with this invention, photoresist materials have been developed which posses the aforementioned desirable characteristics. Additionally, this invention provides high resolution, rapid exposure solid film photoresists which can be readily utilized in the manufacture of various printed circuit devices.

Generally speaking, this invention involves image treatment of a solid surface by a photoresist process which comprises coating or laminating to an etchable solid surface, preferably a metal or metal clad substrate, a substantially solid, tack-free layer of a photocurable composition consisting essentially of:

1. a polyene containing at least two reactive unsaturated carbon to carbon bonds per molecule having a recurring structural formula selected from the group consisting of

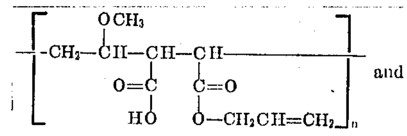

and

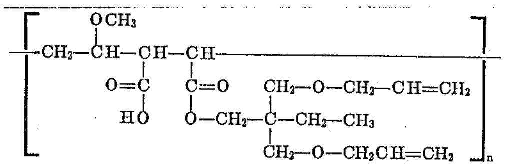

where $n$ is at least 5

2. a polythiol containing at least two thiol groups per molecule, the total combined functionality of (a) the reactive unsaturated carbon to carbon bonds per molecule in the polyene and (b) the thiol groups per molecule in the polythiol being greater than four, and 3. 0.005 to 50 parts by weight based on 100 parts by weight of (1) and (2) supra of a photocuring rate accelerator, exposing said composition through an image bearing transparency or mask to a free radical generator such as electromagnetic radiation having a wavelength of about 2,000–7,000 A or high energy ionizing radiation to selectively cure the exposed portion of the composition, removing the uncured portion of the composition thus baring the metal beneath the removed uncured portion of the composition, removing the exposed metal from the substrate to the desired depth and thereafter; if desired, removing the cured composition thus leaving defined metal areas on the substrate.

Alternatively, after removing the unexposed areas of the composition, the exposed metal areas of the substrate can be plated with other metals followed by removal of the cured composition adhering to the substrate and removal by etching of the metal thereunder resulting in a plated metal or metal clad substrate.

The present invention is best understood by reference to the following description taken in connection with the accompanying drawings, in which:

FIGS. I and VII are isometric views of a laminated metal clad board or substrate.

FIGS. II–VI and VIII–XIII are sectional views taken through the board of FIG. I and showing successive steps in the use of the solid layer photocurable resist composition according to the present invention.

Turning to the drawings, which illustrate the use of the described photocurable resist composition for making printed circuit boards and the like, FIGS. I and VII show a board or substrate 10 made up of a covering layer 11 of about 0.0014 inch thick copper sheet laminated to a 0.060 inch thick plastic, paper, ceramic, epoxy glass or other electrically insulating substrate 12 such as is commonly used in the printed circuit industry. Substrate 10 is usually scrubbed with an abrasive cleaner and dried prior to lamination and coating.

FIG. II is a sectional view showing substrate 10 after a layer of the described solid photocurable resist composition 13 is applied, said layer being applied by lamination, usually under pressure.

Additionally, heat may be applied in the laminating step at temperatures from about 20° to about 100° C. The photocurable photoresist layer can also be applied by dissolving same in a solvent, applying the solution to the circuit board and removing the solvent by evaporation or other means to leave a solid layer of the photocurable composition on the circuit board.

The photocurable resist layer 13 usually has a dry coating thickness of about 1 mil although it may range from 0.015 to about 5 mils or more. Optionally, if desired, a UV transparent film (0.25–5.0 mils thick) covering the photoresist composition may be laminated to the metal surface along with the photoresist composition. The UV transparent film is merely a protective covering for the photoresist material to insure cleanliness. The UV transparent film (not shown in the drawings) can be removed prior or subsequent to imagewise exposure. Operable protective films include, but are not limited to polymeric films composed of polyesters, vinyl polymers, polyolefins, cellulose esters, acrylic resins, polyamides, fluorocarbons, etc. Preferred UV transparent film is polyethylene terephthalate or vinyl coated polyethylene terephthalate.

FIG. III shows a mask or image bearing transparency 14 which can be of an electrical circuit that is placed in contact with the solid photocurable resist composition 13. It should also be noted that, instead of a mask or image bearing transparency in contact with the composition, it is possible to project an image onto the curable resist composition and then expose to a free radical generator source. The solid curable resist composition 13 is then exposed for a period ranging from about 2 seconds to about 5 minutes or more and preferably from about 5 to 60 seconds to a free radical generator source such as electromagnetic radiation, e.g., UV light represented by arrows 15. Radiation of wavelength from 2,000–7,000 A units is sufficient to cure the exposed photoresist material. After exposure, the image bearing transparency 14 is removed and the unexposed curable composition is removed with a suitable solvent, e.g. methyl ethyl ketone, as illustrated in FIG. IV.

In FIG. V, the photoresist coated substrate 12 is placed in an etchant for the copper sheet to remove the exposed portion of the metal 11. Such etchants are well known to those skilled in the art, e.g., for example, copper is removed by a suitable acid-type etchant, e.g., a ferric chloride solution or ammonium persulfate solution. The substrate can be placed in a spray type etchant machine of a kind commonly used in the industry which sprays a solution on the surface. The concentration of the ferric chloride, commonly stated in terms of specific gravity can be 38° Baume. Within several minutes the bare, unprotected copper on the substrate surface will be completely etched away. The substrate 12 is then removed and thoroughly rinsed to remove all traces of ferric chloride and then dried.

FIG. VI shows the substrate 12 after it is immersed in a solvent, e.g., a caustic solution etc., to remove the photocured resist composition 16, revealing the bright copper electrical surface 11. The finished copper board can be rinsed in hot water and dried. The step to remove the photoresist is optional as it may be desirous to leave the photocurable resist material in place as a protective coating for the electrical circuit.

FIGS. VII–XIII show an alternative treatment to obtain a plated electrical conducting surface. As shown in FIGS. VII–X, the photocured resist coating is formed in the same manner as in the previously described FIGS. II–VI. After the final exposure as shown in FIG. X, the cured photoresist covered substrate is plated in a metal plating bath producing a metal layer 17 as shown in FIG. XI.

Conventional electroplating environments are usually highly acidic, involve the use of temperatures up to about 120° F., as well as turbulent agitation conditions. It is to be noted that the metal can be deposited on the substrate by plating processes other than electroplating. Operable non-electrolytic plating processes include but are not limited to hot dipping, vacuum evaporation, chemical vapor deposition and various aqueous processes such as contact plating, immersion plating and chemical electroless plating, i.e., deposition of a metal by a redox reaction. Usually prior to the plating step, the metal coated substrate must undergo intensive cleaning procedures particularly in the fabrication of thru-hole printed circuit boards.

Usually, metals which can be deposited included but are not limited to, gold, tin, lead, nickel, zinc, cadmium, silver, copper, etc., as well as alloys thereof.

After the plating step, the photoresist 16 in the unplated areas can be stripped in the same manner as described in FIG. VI. The resulting product is illustrated in FIG. XII which is a coated substrate 12 having metal areas 11 plated with metal surface 17.

Finally, the unplated metal areas 11 of the above described substrate can be similarly etched as described in FIG. V. The final product, as shown in FIG. XIII, is a substrate having metal plating 17 on defined areas 11.

It is to be noted that for purposes of explanation, the invention was defined in terms of an etchable solid metallic surface, however, it is to be understood that image treatment of other chemically etchable solid surfaces, e.g., chemical milling is operable as well. Likewise, the metals which can be etched by the use of the instant invention include, but are not limited to, aluminum, aluminum alloys, brass, chromium, chromium alloys, copper, carbon steel, various stinless steels, tool steel, magnesium, nickel, silver and the like.

The solid film of photocurable composition can be formed by coating a solution or dispersion onto the copper cladding of the substrate and drying the layer by removal of the solvent by any suitable means such as evaporation. The solid photoresist compositions may also be melted and suitably applied directly onto the metal surface of the metal clad substrate. Coating may be carried out by any of the conventional coating procedures such as spraying, dip coating, roller coating, or curtain coating.

This solid photosensitive film can be packaged with a removable protective cover sheet.

The crucial ingredients in the solid photocurable composition to form a photoresist are:

1. a solid polyene containing at least two reactive unsaturated carbon to carbon bonds per molecule having a recurring structural formula selected from the group consisting of

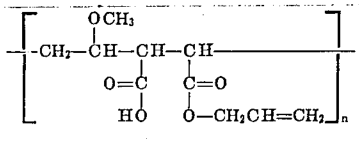

and

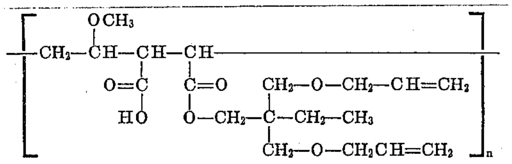

where $n$ is at least 5

2. a polythiol containing at least two thiol groups per molecule, the total combined functionality of (a) the reactive unsaturated carbon to carbon bonds per molecule in the polyene and (b) the thiol groups per molecule in the polythiol being greater than 4, and 3. 0.005 to 50 parts by weight based on 100 parts by weight of (1) and (2) supra of a photocuring rate accelerator.

It is to be understood, however, that when energy sources other than visible or ultraviolet light are used to initiate the curing reaction, photocuring rate accelerators (i.e., photosensitizers, etc.) generally are not required in the formulation.

Various photosensitizers, i.e., photocuring rate accelerators are operable and well known to those skilled in the art. Examples of photosensitizers include but are not limited to benzophenone, acetophenone, acenapthene-quinone, methyl ethyl ketone, valerophenone, γ-phenylbutyrophenone, p-morpholinopropiophenone, dibenzosuberone, 4-morpholinobenzophenone, 4′-morpholinodeoxybenzoin, p-diacetylbenzene, 4-aminobenzophenone, 4′-methoxyacetophenone, benzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]anthracen-7-one, 1-naphthaldehyde, 4,4′-bis(dimethylaminobenzophenone, fluorene-9-one, 1′-acetonaphthone, 2′-acetonaphthone and 2,3-butanedione, etc., which serve to give greatly reduced exposure times and thereby when used in conjunction with various forms of energetic radiation yield very rapid, commercially practical time cycles by the practice of the instant invention.

As used herein, the term "reactive" unsaturated carbon to carbon groups means groups having the structures which will react under proper conditions as set forth herein with thiol groups to yield the thiother linkage $$(-\overset{|}{\underset{|}{C}}-S-\overset{|}{\underset{|}{C}}-),$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene and the like) which do not, under the same conditions, react with thiols to give thioether linkages. In the instant invention, photoresist products from the reaction of polyenes with polythiols which contain two or more thiol groups per average molecule are called polythioether polymers or polythioethers.

As used herein, the term "polythiols" refers to simple or complex organic compounds having a multiplicity of pendant or terminally positioned -SH functional groups per average molecule.

On the average, the polythiols must obtain two or more -SH groups/molecule. They usually have a viscosity range of 0–20 million centipoises (cps) at 70° C as measured by a Brookfield Viscometer. Included in the term "polythiols" as used herein are those materials which, in the presence of an inert solvent, aqueous dispersion or plasticizer, fall within the viscosity range set out above at 70° C. Operable polythiols in the instant invention usually have molecular weights in the range 94–20,000, preferably 100–10,000.

The polythiols operable in the instant invention can be exemplified by the general formula: $R_8(SH)_n$ where $n$ is at least 2 and $R_8$ is a polyvalent organic moiety free from reactive carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any reactive carbon to carbon unsaturation.

One class of polythiols operable with polyenes in the instant invention to obtain a polythioether photoresist are esters of thiol-containing acids of the general formula: $HS-R_9-COOH$ where $R_9$ is an organic moiety containing no "reactive" carbon to carbon unsaturation with polyhydroxy compounds of the general structure: $R_{10}(OH)_n$ where $R_{10}$ is an organic moiety containing no "reactive" carbon to carbon unsaturation and $n$ is two or greater. These components will react under suitable conditions to give a polythiol having the general structure:

$$R_{10}-\left(O\underset{\underset{O}{\|}}{C}-R_9-SH\right)_n$$

where $R_9$ and $R_{10}$ are organic moieties containing no "reactive" carbon to carbon unsaturation and $n$ is two or greater.

Certain polythiols such as the aliphatic monomeric polythiols (ethane dithiol, hexamethylene dithiol, decamethylene dithiol, tolylene-2,4-dithiol, etc., and some polymeric polythiols such as a thiol-terminated ethylcyclohexyl dimercaptan polymer, etc., and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include but are not limited to esters of thioglycolic acid ($HS-CH_2COOH$), α-mercaptopropionic acid ($HS-CH(CH_3)-COOH$) and β-mercaptopropionic acid ($HS-CH_2CH_2COOH$) with polyhydroxy compounds such as glycols, triols, tetraols, pentaols, hexaols, etc. Specific examples of the preferred polythiols include but are not limited to ethylene glycol bis (β-mercaptopropionate), trimethylolpropane tris (thioglycolate), trimethylolpropane tris (β-mercaptopropionate), pentaerythritol tetrakis (thioglycolate), tris (hydroxyethyl) isocyanurate tris (β-mercaptopropionate) and pentaerythritol tetrakis (β-mercaptopropionate), most of which are commercially available. A specific example of a preferred polymeric polythiol is polypropylene ether glycol bis (β-mercaptopropionate) which is prepared from polypropylene ether glycol (e.g., Pluracol P2010, Wynadotte Chemical Corp.) and β-mercaptopropionic acid by esterification.

The preferred polythiol compounds and characterized by a low level of mercaptan-like odor initially, and after reaction, give essentially odorless polythioether end products which are commercially attractive.

The term "functionality" as used herein refers to the average number of ene or thiol groups per molecule in the polyene or polythiol, respectively. For example, a triene is a polyene with an average of three "reactive" carbon to carbon unsaturated groups per molecule and thus has a functionality (*f*) of three. A dithiol is a polythiol with an average of two thiol groups per molecule and thus has a functionality (*f*) of two.

It is further understood and implied in the above definitions that in these systems, the functionality of the polyene and the polythiol component is commonly expressed in whole numbers although in practice the actual functionality may be fractional. For example, a polyene component having a nominal functionality of two (from theoretical considerations alone) may in fact have an effective functionality of somewhat less than two. In an attempted synthesis of a diene from a glycol in which the reaction proceeds to 100 percent of the theoretical value for complete reaction, the functionality (assuming 100 percent pure starting materials) would be 2.0. If, however, the reaction were carried to only 90 percent of theory for complete reaction, about 10 percent of the molecules present would have only one ene functional group and there may be a trace of materials that would have no ene functional groups at all. Approximately 90 percent of the molecules, however, would have the desired diene structure and the product as a whole would then have an actual functionality of 1.9. Such a product is useful as a photoresist in the instant invention and is referred to herein and having a functionality of two.

To obtain the maximum strength, solvent resistance, creep resistance, heat resistance and freedom from tackiness, the reactive components consisting of the polyenes and polythiols in combination with a curing rate accelerator of this invention are formulated in such a manner as to give solid, crosslinked, three dimensional network polythioether polymer systems on curing. In order to achieve such infinite network formation, the individual polyenes and polythiols must each have a functionality of at least two and the sum of the functionalities of the polyene and polythiol components must always be greater than four. Blends and mixtures of the polyenes and the polythiols containing said functionality are also operable herein.

The photoresist compositions to be cured in accord with the present invention may, if desired, include such additives as antioxidants, accelerators, dyes, inhibitors, activators, fillers, thickeners, pigments, anti-static agents, flame-retardant agents, surface-active agents, extending oils, plasticizers and the like within the scope of this invention. Such additives are usually preblended with the polyene or polythiols prior to or during the compounding step. The aforesaid additives may be present in quantities up to 500 or more parts based on 100 parts by weight of the polyene-polythiol photoresist compositions and preferably 0.005–300 parts on the same basis.

The preferred means of curing is by means of electromagnetic radiation of wavelength of about 2,000–4,000 A (because of simplicity, economy and convenience), the polyene-polythiol photoresist composition of the instant invention can be cured also by image-wise directed beams of ionizing irradiation.

When UV radiation is used for the curing reaction, a does of 0,0004 to 6.0 watts/cm$^2$ is usually employed.

PREPARATION OF POLYENES

EXAMPLE 1

50 g of poly(methyl vinyl ether/maleic anhydride), an interpolymer having a specific viscosity (1 gram in 100 ml methyl ethyl ketone at 25° C) in the range 0.1 to 0.5 and commercially available from GAF Corporation, was dissolved in methyl ethyl ketone in a resin kettle equipped with stirrer, condenser, thermometer and a gas inlet and outlet. 0.5 g p-toluenesulfonic acid as a catalyst was added to the kettle followed by the dropwise addition of 20 g allyl alcohol. The reaction was carried out for 16 hours while maintaining the temperature at 60°–70° C. The mixture was poured into petroleum ether in a blender to precipitate a solid which was dried in a vacuum oven resulting in a partially esterified rubbery white solid (54 g) having the following recurring structural unit:

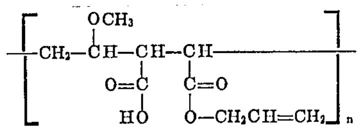

where *n* is at least five as indicated by NMR. Characterization of the partial ester by acid titration showed an 80 percent half ester content. This polyene will hereinafter be referred to a Polyene A.

EXAMPLE 2

50 g of poly(methyl vinyl ether/maleic anhydride), an interpolymer having a specific viscosity (1 g in 100 ml methyl ethyl ketone at 25° C) in the range 0.1 to 0.5 and being commercially available from GAF Corporation was dissolved in 300 ml. tetrahydrofuran and charged to a resin kettle equipped with stirrer, condenser, thermometer and gas inlet and outlet. 0.125 g of p-toluenesulfonic acid was added to the kettle as a catalyst.

80 g trimethylol propane diallyl ether were added dropwise to the kettle and the reaction was carried out in refluxing tetrahydrofuran for about 16 hours. The reaction mixture was poured into petroleum ether and the resulting solid dried in a vacuum oven. The partially esterified resulting product (54 g) was characterized as a white rubbery solid which NMR showed as having the following recurring unit:

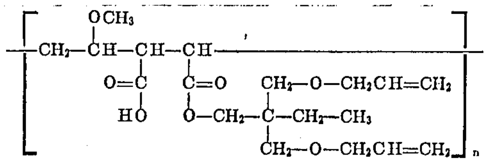

where *n* is at least five. This polyene will hereinafter be referred to as Polyene B.

EXAMPLE 3

25 g of poly(methyl vinyl ether/maleic anhydride), an interpolymer having a specific viscosity (1 g in 100 ml methyl ethyl ketone at 25° C) in the range 1.0 to 1.4 and being commercially available from GAF Corporation was dissolved in 300 ml tetrahydrofuran and charged to a resin kettle equipped with stirrer, condenser, thermometer and gas inlet and outlet. 0.125 g of p-toluenesulfonic acid was added to the kettle as a catalyst.

40 g trimethylol propane diallyl ether were added dropwise to the kettle and the reaction was carried out in refluxing tetrahydrofuran for about 16 hours. The reaction mixture was poured into petroleun ether and the resulting solid dried in a vacuum oven. The partially esterified resulting product (35 g) was characterized as white rubbery solid which NMR showed as having the following recurring unit:

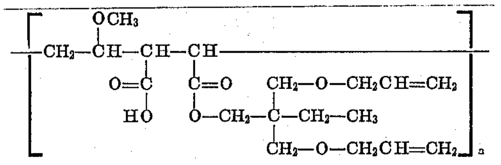

where *n* is at least five. This polyene will hereinafter be referred to as Polyene C.

EXAMPLE 4

An admixture of 2.14 g of Polyene A from Example 1, 1.22 g of pentaerythritol tetrakis (β -mercaptopropionate) commercially available from Carlisle Chemical Company under the tradename "Q-43" and 0.3 g benzophenone were dissolved in methyl ethyl ketone. The solution was applied uniformly to the copper surface of a circuit board comprising a 0.001 inch thick copper cladding on a 0.050 inch epoxy-glass substrate.

The methyl ethyl ketone was allowed to evaporate, leaving a 1 mil solid photocurable coating of the admixture on the copper. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 3,800 microwatts/cm$^2$ for 1 minute. The major spectral lines of this lamp were all above 3,000A. The negative transparency was removed and the coating was washed in methyl ethyl ketone to remove the unexposed, uncured portion thereof, thus exposing the copper thereunder. The imaged circuit board was then etched in an aqueous 30 percent by weight ammonium persulfate solution for about 5 minutes at 120° F to remove the exposed copper, followed by a water wash. The cured photoresist coating was then removed in an aqueous 10 percent NaOH solution, thus revealing the desired copper electrical circuit.

EXAMPLE 5

An admixture of 10.0 g of Polyene B from Example 2. 6.6 g of pentaerythritol tetrakis (β -mercaptopropionate) commercially available from Carlisle Chemical Company under the tradename "Q-43" and 0.1 g benzophenone were dissolved in 25 ml tetrahydrofuran. The solution was applied uniformly to the copper surface of a circuit board comprising a 0.001 inch thick copper cladding on a 0.050 inch epoxy-glass substrate.

The tetrahydrofuran was allowed to evaporate, leaving a 1 mil solid photocurable coating of the admixture on the copper. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 3,800 microwatts/cm$^2$ for 1 minute. The major spectral lines of this lamp were all above 3,000A. The negative transparency was removed and the coating was washed in tetrahydrofuran to remove the unexposed, uncured portion thereof, thus exposing the copper thereunder. The imaged circuit board was then etched in an aqueous 30 percent by weight ammonium persulfate solution for about 5 minutes at 120° F to remove the exposed copper, followed by a water wash. The cured photoresist coating was then removed in an aqueous 10 percent NaOH solution, thus revealing the desired copper electrical circuit.

EXAMPLE 6

An admixture of 10.0 g of Polyene C from Example 3, 6.6 g of pentaerythritol tetrakis (β -mercaptopropionate) commercially available from Carlisle Chemical Company under the tradename "Q-43" and 0.1 g benzophenone were dissolved in 25 ml tetraphdryfuran. The solution was applied uniformly to the copper surface of a circuit board comprising a 0.001 inch thick copper cladding on a 0.050 inch epoxy-glass substrate.

The tetrahydrofuran was allowed to evaporate, leaving a 1 mil solid photocurable coating of the admixture on the copper. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 3,800 microwatts/cm$^2$ for 1 minute. The major spectral lines of this lamp were all above 3,000A. The negative transparency was removed and the coating was washed in methyl ethyl ketone to remove the unexposed, uncured portion thereof, thus exposing the copper thereunder. The imaged circuit board was then etched in an aqueous 30 percent by weight ammonium persulfate solution for about 5 minutes at 120° F to remove the exposed copper, followed by a water wash. The cured photoresist coating was then removed in an aqueous 10 percent NaOH solution, thus revealing the desired copper electrical circuit.

EXAMPLE 7

Example 4 was repeated except that 1.32 g of trimethylopropane tris (β -mercaptopropionate) commercially available from Carlisle Chemical Company under the tradename "P-33" was substituted for the 1.22 g of "Q-43." The procedure resulted in the same quality copper electrical circuit board.

EXAMPLE 8

An admixture of 2.14 g of Polyene A from Example 1, 1.22 g of pentaerythritol tetrakis (β -mercaptopropionate) commercially available from Carlisle Chemical Company under the tradename "Q-43" and 0.3 g benzophenone were dissolved in methyl ethyl ketone. The solution was applied uniformly to a 1 mil thick protective polyethylene terephthalate film. The methyl ethyl ketone was allowed to evaporate leaving a 1 mil solid photocurable coating of the admixture on the film. A second protective 1 mil thick polyethylene film was laminated to the coating under pressure at 60° C to form a sandwich. The polyethylene film was stripped off and the coating on the polyethylene terephthalate film was brought in contact with the copper cladding of a clean copper clad epoxy-glass printed circuit board blank. Heat (80° C) and pressure are applied to make the laminate. The polyethylene terephthalate film was stripped off. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 3,800 microwatts/cm$^2$ for 1 minute. The major spectral lines of this lamp were all above 3,000A. The negative transparency was removed and the coating was washed in methyl ethyl ketone to remove the unexposed, uncured portion thereof, thus exposing the copper thereunder.

The photocured resist coated substrate was then dipped in a 20 percent ammonium persulfate solution (pH = 2) rinsed in water, dipped in 10 percent sulfuric acid solution and finally rinsed thoroughly prior to immersion into an electroplating bath. The cleaned photocured resist bearing copper clad substrate was electroplated for 15 minutes with a tin-lead alloy plating bath at room temperature, pH of about 2, and a current density of 5 amperes/sq. ft. A uniform layer of tin-lead alloy was deposited on the copper areas unprotected by the photocured resist layer. The photocured resist layer which exhibited excellent resistance to breakdown in the plating environment was thereafter easily stripped from the copper surface by dipping the substrate in a 10 percent caustic stripping solution followed by a water spray rinse. The unplated areas of copper were etched in an automatic etcher using a spray of a conventional chromic acid solution for about 15 minutes at about 90° F. The resulting product was an improved tin-lead plated copper electrical circuit on an epoxy-glass substrate.

The weight ratio of the polyene:polythiol employed in the instant invention is in the range 1:0.1–0.8 respectively.

I claim:

1. A process of image treating a solid surface comprising:

a. applying to an etchable solid surface a solid layer of a photocurable composition consisting essentially of 1. a solid polyene containing at least two reactive unsaturated carbon to carbon bonds per molecule having a recurring structural formula selected from the group consisting of

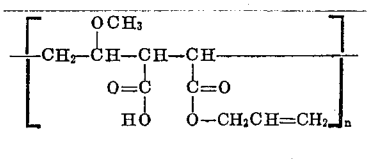

and

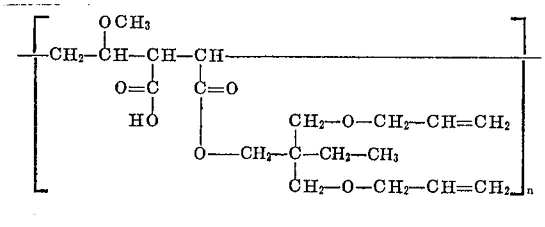

where $n$ is at least 5

2. a polythiol containing at least two thiol groups per molecule, the total combined functionality of (a) the reactive unsaturated carbon to carbon bonds per molecule in the polyene and (b) the thiol groups per molecule in the polythiol being greater than four, and the weight ratio of the polyene: polythiol being in the range 1:0.1–0.8 respectively and
3. 0.005 to 50 parts by weight based on 100 parts by weight of said polyene and said polythiol of a photocuring rate accelerator, b. exposing said composition through an image-bearing transparency to UV or high energy ionizing radiation thereby selectively curing the exposed portions of said composition, c. removing said image-bearing transparency and d. removing the uncured portion of the photocurable composition, thereby baring said etchable solid surface beneath the removed uncured portion of the composition.

2. The process according to claim 1 wherein the composition is applied to the surface by lamination.

3. The process according to claim 1 wherein the composition is applied to the surface as a coating in solution and the solvent is removed.

4. A process for making a printed circuit board comprising the steps of:

a. applying to the surface of a metal clad printed circuit board a solid photocurable composition consisting essentially of 1. a solid polyene containing at least two reactive unsaturated carbon to carbon bonds per molecule having a recurring structural formula selected from the group consisting of

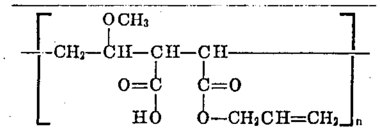

and

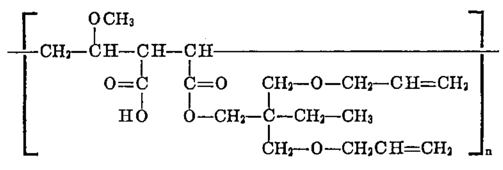

where $n$ is at least five 2. a polythiol containing at least two thiol groups per molecule, the total combined functionality of (a) the reactive unsaturated carbon to carbon bonds per molecule in the polyene and (b) the thiol groups per molecule in the polythiol being greater than four and the weight ratio of the polyene:polythiol being in the range 1:0.1–0.8 respectively and 3. 0.005 to 50 parts by weight based on 100 parts by weight of said polyene and said polythiol of a photocuring rate accelerator b. exposing said photocurable composition through an image-bearing transparency to UV or high energy ionizing radiation thereby selectively curing the exposed portions of the composition, c. removing said image-bearing transparency, d. removing the unexposed uncured portion of said composition thereby baring the metal clad surface beneath, e. etching away the exposed metal portions of said surface and f. optionally removing the cured portion of said composition from said board.

5. The process according to claim 4 wherein the composition is applied to the surface by lamination.

6. The process according to claim 4 wherein the composition is applied to the surface as a coating in solution and the solvent is removed.

7. A process for plating metal comprising:

a. applying to an etchable metal surface a solid layer of a photocurable composition consisting essentially of:

1. a solid polyene containing at least two reactive unsaturated carbon to carbon bonds per molecule having a recurring structural formula selected from the group consisting of

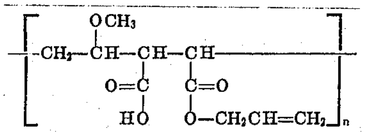

and

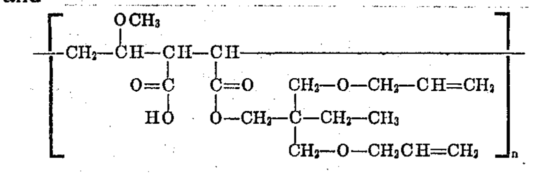

where $n$ is at least 5

2. a polythiol containing at least two thiol groups per molecule, the total combined functionality of (a) the reactive unsaturated carbon to carbon bonds per molecule in the polyene and (b) the thiol groups per molecule in the polythiol being greater than four and the weight ratio of the polyene:polythiol being in the range 1:0.1–0.8 respectively and 3. 0.005 to 50 parts by weight based on 100 parts by weight of said polyene and said polythiol of a photocuring rate accelerator, b. exposing said composition through an image-bearing transparency to UV or high energy ionizing radiation thereby selectively curing the exposed portions of said composition, c. removing said image-bearing transparency, d. removing the uncured portion of the photocurable composition, thereby baring said metal surface beneath the removed uncured portion of the composition, e. plating a metal onto the exposed etchable metal areas of said surface, f. removing the cured portion of said composition from said etchable surface, and g. etching the exposed unplated metal areas of said etchable surface to the desired depth.

8. A process according to claim 7 wherein said plating metal is tin-lead alloy.

9. A process according to claim 7 wherein said plating metal is gold.

10. A process according to claim 7 whereas said etchable metal surface is perforated.

11. The process according to claim 7 wherein the composition is applied to the surface by lamination.

12. The process according to claim 7 wherein the composition is applied to the surface as a coating in solution and the solvent is removed.

* * * * *